(12) United States Patent
Xu

(10) Patent No.: US 10,205,129 B2
(45) Date of Patent: Feb. 12, 2019

(54) ORGANIC LIGHT EMITTING DISPLAY PANEL COMPRISING A QUANTUM MATERIAL LAYER, MANUFACTURING METHOD THEREOF, AND DISPLAY DEVICE

(71) Applicant: BOE TECHNOLOGY GROUP CO., LTD., Beijing (CN)

(72) Inventor: Xianbin Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/300,153

(22) PCT Filed: Jan. 27, 2016

(86) PCT No.: PCT/CN2016/072293
§ 371 (c)(1),
(2) Date: Sep. 28, 2016

(87) PCT Pub. No.: WO2017/012326
PCT Pub. Date: Jan. 26, 2017

(65) Prior Publication Data
US 2017/0179438 A1   Jun. 22, 2017

(30) Foreign Application Priority Data
Jul. 17, 2015 (CN) .......................... 2015 1 0425528

(51) Int. Cl.
*H01L 51/52* (2006.01)
*H01L 27/32* (2006.01)
(Continued)

(52) U.S. Cl.
CPC ........ *H01L 51/5281* (2013.01); *H01L 27/322* (2013.01); *H01L 27/3213* (2013.01);
(Continued)

(58) Field of Classification Search
CPC .............. H01L 51/5281; H01L 27/322; H01L 27/3213; H01L 51/56; H01L 51/0019;
(Continued)

(56) References Cited

U.S. PATENT DOCUMENTS 9,455,414 B2   9/2016   Shu et al.
9,484,393 B2   11/2016  Qi et al.
(Continued)

FOREIGN PATENT DOCUMENTS

CN   103236435 A   8/2013
CN   103700674 A   4/2014
(Continued)

OTHER PUBLICATIONS

Office Action dated Jul. 3, 2017 issued in corresponding Chinese Application No. 201510425528.8.
(Continued)

*Primary Examiner* — Thanh T Nguyen
(74) *Attorney, Agent, or Firm* — Nath, Goldberg & Meyer; Joshua B. Goldberg

(57) ABSTRACT

The invention provides an organic light emitting display panel and a manufacturing method thereof, and a display device. In the organic light emitting display panel and the manufacturing method thereof, and the display device of the invention, since a quantum material layer exhibiting quantum size effects is arranged on a side of a color filter substrate close to an array substrate or on a side of an array substrate close to a color filter substrate, and can convert a part of light emitted thereinto from the organic light emitting unit into light with a same color as that of a corresponding sub-pixel, the utilization rate of light emitted from the organic light emitting unit is increased, brightness is improved, and power consumption is reduced.

20 Claims, 4 Drawing Sheets

(51) Int. Cl.
*H01L 51/00* (2006.01)
*H01L 51/56* (2006.01)

(52) U.S. Cl.
CPC .......... *H01L 51/0019* (2013.01); *H01L 51/56* (2013.01); *H01L 2251/5369* (2013.01)

(58) Field of Classification Search
CPC . H01L 2251/5369; H01L 27/32; H01L 51/00; H01L 51/52; H01L 21/77
See application file for complete search history.

(56) References Cited

U.S. PATENT DOCUMENTS

| | | | |
|---|---|---|---|
| 2012/0223633 A1* | 9/2012 | Yoshinaga | H01L 27/3211 313/504 |
| 2014/0091275 A1 | 4/2014 | Coe-Sullivan et al. | |
| 2015/0048348 A1 | 2/2015 | Huang et al. | |
| 2015/0380671 A1* | 12/2015 | Shu | G02F 1/133617 257/13 |

FOREIGN PATENT DOCUMENTS

| | | |
|---|---|---|
| CN | 103730472 A | 4/2014 |
| CN | 105097878 A | 11/2015 |

OTHER PUBLICATIONS

International Search Report dated May 5, 2016, corresponding to International application No. PCT/CN2016/072293.
Written Opinion of the International Searching Authority dated May 5, 2016, corresponding to International application No. PCT/CN2016/072293.

* cited by examiner

ORGANIC LIGHT EMITTING DISPLAY PANEL COMPRISING A QUANTUM MATERIAL LAYER, MANUFACTURING METHOD THEREOF, AND DISPLAY DEVICE

CROSS REFERENCE

This is a National Phase Application filed under 35 U.S.C. 371 as a national stage of PCT/CN2016/072293 filed on Jan. 27, 2016, an application claiming the benefit of Chinese application no. 201510425528.8 filed on Jul. 17, 2015, the content of each of which is hereby incorporated by reference in its entirety.

FIELD OF THE INVENTION

The invention relates to the field of display technology, and particularly to an organic light emitting display panel and a manufacturing method thereof, and a display device.

BACKGROUND OF THE INVENTION

A quantum dot material refers to a material exhibiting quantum size effects in three dimensions, that is, the characteristic size of the material is comparable to the electron De Broglie wavelength, the coherent wavelength and the exciton Bohr radius, the electrons are confined in nanospace, the electron transport is restricted, the average free path of the electron is very short, locality and coherence of the electrons are enhanced, and at this time, a quasi continuous band is evolved into a discrete energy level structure. This special energy level structure makes the quantum dots have photoluminescence and electroluminescence properties. The luminescence spectra can be prepared by controlling structure, material and particle size of the quantum dots. The light emitted by the CdSe quantum dots can cover all the visible spectra from red to purple, which can be achieved only by controlling the preparation parameters such as structure, material and particle size. The light emitted by the quantum dots has properties of high brightness, high color purity, narrow half peak width (FWHM~30 nm), etc.

Compared with a liquid crystal display, an organic light emitting diode (OLED) has advantages such as self luminescence, fast response, wide viewing angle, high brightness, bright color, lightweight and thinness and so on, and is considered as the next generation display technology. However, due to the fact that only a part of light emitted from the organic light emitting layer passes through the color filter layer, the light utilization rate of the organic light emitting layer is low, and the power consumption is large.

SUMMARY OF THE INVENTION

An object of the invention is to solve the problem existing in the prior art that an organic light emitting layer in an organic light emitting display panel and a display device emits light with a low utilization rate and high power consumption.

A solution employed to solve the problem of the invention is an organic light emitting display panel, including: an array substrate and a color filter substrate arranged opposite to each other; an organic light emitting unit, which is arranged on a side of the array substrate close to the color filter substrate, the array substrate being configured to control the organic light emitting unit to emit light; and a plurality of pixel units arranged in a matrix formed by the array substrate and the color filter substrate, and each pixel unit including a plurality of sub-pixels;

wherein, the organic light emitting display panel further includes a quantum material layer at a sub-pixel region where a wavelength of light emitted from the organic light emitting unit is smaller than that of a color of the sub-pixel, and the quantum material layer can exhibit size effect to convert a part of light emitted thereinto from the organic light emitting unit to light of a same color as that of a corresponding sub-pixel.

Preferably, the quantum material layer is provided on a side of the color filter substrate close to the array substrate. In this case, the color filter substrate further includes a substrate and a color filter layer provided on the substrate, and the quantum material layer is provided on the color filter layer.

Optionally, the quantum material layer is provided on a side of the array substrate close to the color filter substrate. In this case, the color filter substrate further includes a color filter layer; or the array substrate further includes a color filter layer provided above the quantum material layer.

Preferably, the plurality of sub-pixels include primary color sub-pixels and white sub-pixels; and the primary color sub-pixels include red sub-pixels, blue sub-pixels, green sub-pixels, and yellow sub-pixels.

Preferably, the organic light emitting unit includes a white light source and a blue light source.

Preferably, the organic light emitting unit is the white light source; the color filter substrate includes sub-pixel color filter layers corresponding to the red sub-pixels, the blue sub-pixels, the green sub-pixels, and the yellow sub-pixels, respectively; and the quantum material layer includes sub-pixel quantum material layers corresponding to the red sub-pixels, the green sub-pixels, and the yellow sub-pixels, respectively.

Preferably, the organic light emitting unit is the blue light source;

the color filter substrate includes sub-pixel color filter layers corresponding to the red sub-pixels, the green sub-pixels, and the yellow sub-pixels, respectively; and the quantum material layer includes sub-pixel quantum material layers corresponding to the red sub-pixels, the green sub-pixels, the yellow sub-pixels, and the white sub-pixels, respectively.

Preferably, the quantum material layer includes a quantum dot, a quantum rod, and/or a quantum plate.

Preferably, the quantum dot, the quantum rod and the quantum plate each includes a core material, a ligand and a shell material, and the core material includes CdS, CdSe, CdTe, PbSe, CuInS, InP or a carbon nanomaterial.

Another object of the invention is to provide a method for manufacturing the above organic light emitting display panel, including steps of:

preparing an array substrate;

preparing an organic light emitting layer on the array substrate;

preparing a color filter substrate;

preparing a quantum material layer on the color filter substrate; and assembling the array substrate provided with the organic light emitting layer and the color filter substrate provided with the quantum material layer so that the array substrate and the color filter substrate are arranged opposite to each other.

Preferably, the step of preparing a quantum material layer on the color filter substrate includes mixing a quantum material with a negative photoresist, and forming the quantum material layer by a patterning process or an ink jet printing method.

Another object of the invention is to provide a method for manufacturing the above organic light emitting display panel, including steps of:

preparing an array substrate;

preparing an organic light emitting layer on the array substrate;

preparing a quantum material layer on the organic light emitting layer;

preparing a color filter substrate; and assembling the array substrate provided with the organic light emitting layer and the quantum material layer and the color filter substrate so that the array substrate and the color filter substrate are arranged opposite to each other.

Preferably, the step of preparing a quantum material layer on the organic light emitting layer includes mixing a quantum material with a negative photoresist, and forming the quantum material layer by a patterning process or an ink jet printing method.

Another object of the invention is to provide a method for manufacturing the above organic light emitting display panel, including steps of:

preparing an array substrate;

preparing an organic light emitting layer on the array substrate;

preparing a quantum material layer on the organic light emitting layer; and preparing a color filter layer on the quantum material layer.

Preferably, the step of preparing a quantum material layer on the organic light emitting layer includes mixing a quantum material with a negative photoresist, and forming the quantum material layer by a patterning process or an ink jet printing method.

Preferably, the step of preparing the color filter layer on the quantum material layer includes preparing the color filter layer at a low temperature.

Another object of the invention is to provide an organic light emitting display device, including the above organic light emitting display panel.

In the organic light emitting display panel and the manufacturing method thereof, and the display device of the invention, since the quantum material layer exhibiting quantum size effects is arranged on a side of the color filter substrate close to the array substrate or on a side of the array substrate close to the color filter substrate, and the photoluminescence properties of the quantum material layer cause a part of light emitted thereinto from the organic light emitting unit to be converted into light with a same color as that of a corresponding sub-pixel, thus the utilization rate of light emitted from the organic light emitting unit is increased, brightness is improved, and power consumption is reduced.

Figure 1:
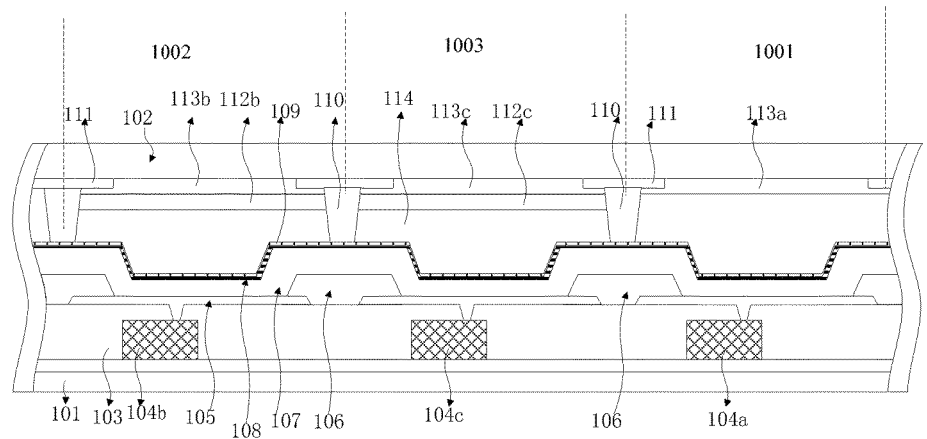
FIG. 1 is a schematic view of a structure of a top-emission type organic light emitting display panel, an organic light emitting unit of which emits white light, according to a first embodiment of the invention.

IN THE DRAWINGS 101. glass substrate; 102. glass cover plate; 103. array backplate; 104. thin film transistor; 105. anode; 106. pixel defining layer; 107. organic light emitting layer; 108. cathode; 109. packaging layer; 110. support; 111. black matrix; 112. quantum dot layer; 113. color filter layer; 114. planarization layer; 1001. blue sub-pixel; 1002. red sub-pixel; 1003. green sub-pixel; 1004. yellow sub-pixel; 1005. white sub-pixel.

DETAILED DESCRIPTION OF THE EMBODIMENTS

In order to make a person skilled in the art better understand solutions of the invention, the invention will be further described in detail in combination of the drawings and the specific embodiments.

First Embodiment

As shown in FIG. 1, the embodiment provides an organic light emitting display panel, including: an array substrate and a color filter substrate arranged opposite to each other; an organic light emitting unit, which is arranged on a side of the array substrate close to the color filter substrate, the array substrate being configured to control the organic light emitting unit to emit light; and a plurality of pixel units arranged in a matrix formed by the array substrate and the color filter substrate, and each pixel unit including a plurality of sub-pixels;

wherein, the organic light emitting display panel further includes a quantum material layer at a sub-pixel region where a color of light emitted from the organic light emitting unit is not consistent with a color of the sub-pixel and a wavelength of light emitted from the organic light emitting unit is smaller than a wavelength of the color of the sub-pixel, and the quantum material layer is provided on a side of the color filter substrate close to the array substrate or on a side of the array substrate close to the color filter substrate, and can exhibit size effect;

the quantum material layer can convert a part of light emitted thereinto from the organic light emitting unit into light of a same color as that of a corresponding sub-pixel.

In the organic light emitting display panel and the manufacturing method thereof, and the display device of the invention, since the quantum material layer exhibiting quantum size effects is arranged on the side of the color filter substrate close to the array substrate or on the side of the array substrate close to the color filter substrate, and can convert a part of light emitted thereinto from the organic light emitting unit into light with a same color as the corresponding sub-pixel based on its photoluminescence properties, thus the utilization rate of light emitted from the organic light emitting unit is increased, brightness is improved, and power consumption is reduced.

It should be understood that, based on whether or not the color of light emitted from the organic light emitting unit is consistent with the color of the corresponding sub-pixel, it can be determined whether or not a quantum material layer and/or a sub-pixel color filter layer of the corresponding color is required to be provided at a region corresponding to the sub-pixel.

For example, when the color of light emitted from the organic light emitting unit is consistent with the color of the corresponding sub-pixel, it is not required to provide the quantum material layer and the sub-pixel color filter layer of the corresponding color at the region corresponding to the sub-pixel; when the color of light emitted from the organic light emitting unit is not consistent with the color of the corresponding sub-pixel and the wavelength of light emitted from the organic light emitting unit is larger than that of the color of the sub-pixel, it is also not required to provide the quantum material layer at the region corresponding to the sub-pixel, however, it is required to provide the sub-pixel color filter layer of the corresponding color at the region.

The quantum material layer and the sub-pixel color filter layer of the corresponding color may be flexibly provided based on the color of light emitted from the organic light emitting unit, the color of each sub-pixel, and wavelengths of the two colors.

Roles of the above sub-pixel color filter layer include filtering undesired color and improving color purity, and preventing high-energy light (<490 nm) in the external environment from exciting the quantum dot layer, so as to avoid nonautonomous luminescence.

Particularly, the invention will be described by taking a top-emission type display panel, the organic light emitting layer of which emits white light, as an example. It should be understood that, the invention is also applicable to a bottom-emission type display panel.

As shown in FIG. 1, a color filter substrate is provided on a glass cover plate 102, and an array substrate is provided on a glass substrate 1. FIG. 1 illustrates three sub-pixels from left to right, which are a red sub-pixel 1002, a green sub-pixel 1003, and a blue sub-pixel 1001, respectively, and these three sub-pixels form a pixel unit. Of course, a pixel unit may also be formed by a combination of sub-pixels of other colors in the prior art.

The array backplate 103 includes a gate, a gate insulating layer, an active layer, a source, a drain, a passivation layer, a planarization layer, and so on (not shown in FIG. 1), and of course, the array backplate 103 may include an etching stop layer. Each thin film transistor 104 corresponds to one sub-pixel, for example, the thin film transistor 104a corresponds to the blue sub-pixel 1001, the thin film transistor 104b corresponds to the red sub-pixel 1002, and the thin film transistor 104c corresponds to the green sub-pixel 1003.

The thin film transistor 104 is connected to an anode 105, and one anode 105 corresponds to one sub-pixel; two adjacent sub-pixels are separated from each other by a pixel defining layer 106; an organic light emitting layer 107 is provided on the anode 105; a cathode 108 is provided on the organic light emitting layer 107 to correspond to a sub-pixel; a packaging layer 109 made of an inorganic film, an organic film or a composite film may be provided on the cathode 108, and when the array substrate and the color filter substrate are assembled together, it is required to provide a planarization film 114 on the packaging layer 109.

A black matrix 111 is provided between every two adjacent sub-pixels; a sub-pixel color filter layer 113 (113a, 113b, 113c) is provided between every two adjacent black matrixes 111; a support 110 for supporting the assembled array substrate and color substrate is provided at a place corresponding to the black matrix 111; and a sub-pixel quantum dot layer 112 (112b, 112c) is provided between a certain sub-pixel color filter layer 113 and the organic light emitting layer 107.

In the case that the organic light emitting layer 107 emits white light, a sub-pixel quantum dot layer 112b is provided at a region corresponding to the red sub-pixel 1002 to convert light in the white light spectrum, a wavelength of which is smaller than that of the red sub-pixel 1002, into red light;

a sub-pixel quantum dot layer 112c is provided at a region corresponding to the green sub-pixel 1003 to convert light in the white light spectrum, a wavelength of which is smaller than that of the green sub-pixel 1003, into green light;

it is not required to provide a sub-pixel quantum dot layer at a region corresponding to the blue sub-pixel 1001, since there is no light in the white light spectrum, a wavelength of which is smaller than that of the blue sub-pixel 1001.

Preferably, the sub-pixels include primary color sub-pixels and white sub-pixels; the primary color sub-pixels include red sub-pixels, blue sub-pixels, green sub-pixels and yellow sub-pixels.

It should be understood that, a combination of sub-pixels for forming a pixel unit may be: red-green-blue, red-green-blue-white, red-green-blue-yellow, red-green-blue-yellow-white, and so on.

Preferably, the organic light emitting unit is a white light source or a blue light source. It should be understood that, the organic light emitting unit may be a light source of other color, as long as the quantum material layer and the sub-pixel color filter layer 113 are accordingly provided based on the above rules.

In particular, when the organic light emitting unit is the white light source;

the color filter substrate includes sub-pixel color filter layers 113 corresponding to the primary color sub-pixels respectively; and the quantum material layer includes sub-pixel quantum material layers corresponding to the red sub-pixels, the green sub-pixels, and the yellow sub-pixels, respectively.

Preferably, when the organic light emitting unit is the blue light source;

the color filter substrate includes sub-pixel color filter layers 113 corresponding to the red sub-pixels, the blue sub-pixels, and the yellow sub-pixels, respectively; and the quantum material layer includes sub-pixel quantum material layers corresponding to the red sub-pixels, the green sub-pixels, the yellow sub-pixels, and the white sub-pixels, respectively.

As for the structure of the quantum material, effective sizes in three dimensions of the nano-scopic domain may be identical, for example, the quantum material may be a quantum dot or a cube; or an effective size in one dimension is significantly larger than those in the other two dimensions, for example, the quantum material may be a quantum rod or a cuboid bar; or an effective size in one dimension is significantly smaller than those in the other two dimensions, for example, the quantum material is a quantum plate or a cuboid plate. It should be noted that, even though the effective sizes in three dimensions are different, quantum size effects in three dimensions are all met macroscopically.

In particular, the quantum material layer includes a quantum dot, a quantum rod, and/or a quantum plate.

The quantum dot, the quantum rod and the quantum plate each includes a core material, a ligand and a shell material, and the core material includes CdS, CdSe, CdTe, PbSe, CuInS, InP or a carbon nanomaterial. The ligand and the shell material may be selected according to a practical situation, and will not be elaborated herein.

Whether the above top-emission type organic light emitting display panel may be prepared on the color filter substrate or the array substrate according to the quantum material layer, and the preparation sequence of the quantum material layer and the color filter layer are provided in the following three methods.

Second Embodiment

Figure 2:
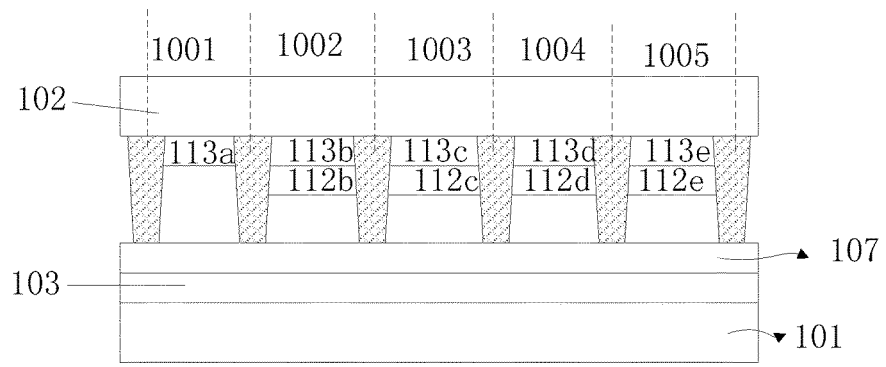
FIG. 2 is a schematic view of a structure of a top-emission type organic light emitting display panel, manufactured by a first method, according to a second embodiment of the invention.

As shown in FIG. 2, in a first method for preparing the top-emission type organic light emitting display panel, the quantum material layer is first prepared on the color filter substrate, and the array substrate and the color filter substrate are assembled.

In particular, the above method for preparing the top-emission type organic light emitting display panel includes the following steps:

S1: preparing an array substrate;

An array backplate 103 (including a thin film transistor 104 and an anode) is prepared on a glass substrate 101 to form the array substrate, and it should be understood that, the method for preparing the array substrate belongs to the prior art, and will not be elaborated herein.

S2: preparing an organic light emitting layer on the array substrate;

In this embodiment, a vacuum evaporation method is used to form the organic light emitting layer 107, in particular, the organic light emitting layer 107 of several colors are simultaneously evaporated on all the pixels of the array substrate so that the organic light emitting layer 107 emits white light, which is then filtered by the color filter layer of each sub-pixel to achieve the display. The manufacturing process of this method is simple, is high in yield rate, and can be used for a large scale display.

It should be understood that, it is also possible to evaporate the sub-pixels of various colors respectively to achieve the display.

It should be understood that, it is also possible to use an ink printing method or a laser transfer printing method to prepare the organic light emitting layer 107, which will not be elaborated herein.

The above step of preparing the array substrate may also include preparing a cathode of the organic light emitting unit, the packaging layer and so on (as shown in FIG. 1), and these methods belong to the prior art and will not be described herein.

S3: preparing a color filter substrate;

A sub-pixel color filter layer 113 corresponding to each sub-pixel is formed on the glass cover plate 102 by a patterning process; as shown in FIG. 2, if the pixel unit includes a blue sub-pixel 1001, a red sub-pixel 1002, a green sub-pixel 1003, a yellow sub-pixel 1004 and a white sub-pixel 1005, the corresponding sub-pixel color filter layers 113 are a blue color filter layer 113a, a red color filter layer 113b, a green color filter layer 113c, a yellow color filter layer 113d and a white color filter layer 113e. It should be understood that, the above pixel unit may also be a combination of other sub-pixels in the prior art, which is not limited herein.

Then, a support 110 is formed by a patterning process.

The patterning process needs post-exposure backing at a higher temperature (>150° C.), which will cause damage to the quantum dots. Thus, it is required to first dry or cure the formed pattern, and then prepare the quantum material layer, so as to prevent the above post-exposure baking or curing from imposing adverse effects on the quantum material such as accumulating or light-emitting quenching.

S4: preparing the quantum material layer on the color filter substrate;

A quantum dot layer 112 is formed by a patterning process, and as shown in FIG. 2, the quantum dot layer 112 includes a red quantum dot layer 112b, a green quantum dot layer 112c, a yellow quantum dot layer 112d and a white quantum dot layer 112e.

The particular preparation process is as follows: if the sub-pixel units include a blue sub-pixel 1001, a red sub-pixel 1002 and a green sub-pixel 1003, a composite layer including red and green exciting quantum dots is used to prepare the corresponding red quantum dot layer 112b and the corresponding green quantum dot layer 112c simultaneously;

If the sub-pixel units include a blue sub-pixel 1001, a red sub-pixel 1002, a green sub-pixel 1003, a yellow sub-pixel 1004 and a white sub-pixel 1005, a composite layer including red, green and yellow exciting quantum dots is used to prepare the corresponding red quantum dot layer 112b, the corresponding green quantum dot layer 112c and the corresponding yellow sub-pixel 1004 simultaneously;

it may be possible to individually use a composite layer of the quantum dots which can combine the excited light into white light to prepare the white sub-pixel 1005.

In the embodiment, a quantum material and a negative photoresist are mixed to form the composite layer, and a patterning process is used to prepare the quantum dot layer 112;

It should be understood that, it is also possible to use an ink jet printing method to form the quantum dot layer 112.

The above steps are described by taking the quantum material layer being the quantum dot layer as an example, and the invention is not limited thereto, and the quantum material layer may also be a quantum rod layer or a quantum plate layer, and the corresponding preparing method is the same as those for the above quantum dot layer, and will not described in detail in the following.

S5: assembling the array substrate provided with the organic light emitting layer and the color filter substrate provided with the quantum material layer so that the array substrate and the color filter substrate are arranged opposite to each other.

An aligning device is used to assemble the array substrate provided with the organic light emitting layer 107 and the color filter substrate provided with the quantum dot layer 112 so that the array substrate and the color filter substrate are arranged opposite to each other, which belongs to the prior art and will not be elaborated herein.

Third Embodiment

Figure 3:
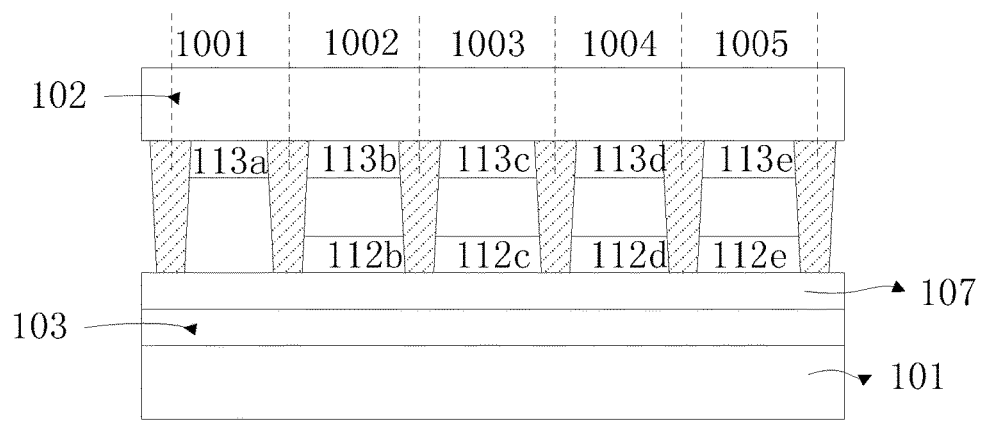
FIG. 3 is a schematic view of a structure of a top-emission type organic light emitting display panel, manufactured by a second method, according to a third embodiment of the invention.

As shown in FIG. 3, in a second method for preparing the top-emission type organic light emitting display panel, the organic light emitting layer and the quantum material layer are sequentially prepared on the array substrate, and the array substrate and the color filter substrate are assembled.

In particular, the above method for preparing the top-emission type organic light emitting display panel includes the following steps:

S1: preparing an array substrate;

An array backplate 103 (including a thin film transistor 104 and an anode) is prepared on a glass substrate 101 to form the array substrate, and it should be understood that, the method for preparing the array substrate belongs to the prior art, and will not be elaborated herein.

S2: preparing an organic light emitting layer on the array substrate;

In this embodiment, a vacuum evaporation method is used to form the organic light emitting layer 107, in particular, the organic light emitting layer 107 of several colors are simultaneously evaporated on all the pixels of the array substrate so that the organic light emitting layer 107 emits white light, which is then filtered by the color filter layer of each sub-pixel to achieve the display. The manufacturing process of this method is simple, is high in yield rate, and can be used for a large scale display.

It should be understood that, it is also possible to evaporate the sub-pixels of various colors respectively to achieve the display.

It should be understood that, it is also possible to use an ink printing method or a laser transfer printing method to prepare the organic light emitting layer 107, which will not be elaborated herein.

S3: preparing a quantum material layer on the organic light emitting layer;

A quantum dot layer 112 is formed on the organic light emitting layer 107 by a patterning process. In the embodiment, a quantum material and a negative photoresist are mixed to prepare the quantum dot layer 112 by a patterning process, and the detailed preparation method is the same as that in the second embodiment; since the material of the organic light emitting layer 107 has high requirements on temperature (<100° C.) and water oxygen, the patterning process for the quantum dots should be performed on the premise that the lifetime of the quantum dots are ensured, and at the same time it is also required to ensure that the organic light emitting layer 107 is not destroyed. The above method of mixing the quantum material and negative photoresist and preparing the quantum dot layer 112 by a patterning process can meet the requirements on low temperature and low water oxygen so as to avoid damage to the organic light emitting layer 107.

It should be understood that, it is also possible to form the quantum dot layer 112 by an ink jet printing method.

In the similar manner as in the second embodiment, the quantum material layer in the embodiment may be a quantum rod layer or a quantum plate layer.

S4: preparing a color filter substrate;

A color filter layer 103 corresponding to each sub-pixel is formed on the glass cover plate 102 by a patterning process; and a support 110 is formed by a patterning process.

Both the above patterning processes need post-exposure baking at high temperature (>150° C.).

S5: assembling the array substrate provided with the organic light emitting layer and the quantum material layer and the color filter substrate so that the array substrate and the color filter substrate are arranged opposite to each other.

An aligning device is used to assemble the array substrate provided with the organic light emitting layer 107 and the quantum dot layer 112 and the color filter substrate so that the array substrate and the color filter substrate are arranged opposite to each other, which belongs to the prior art and will not be elaborated herein.

Fourth Embodiment

Figure 4:
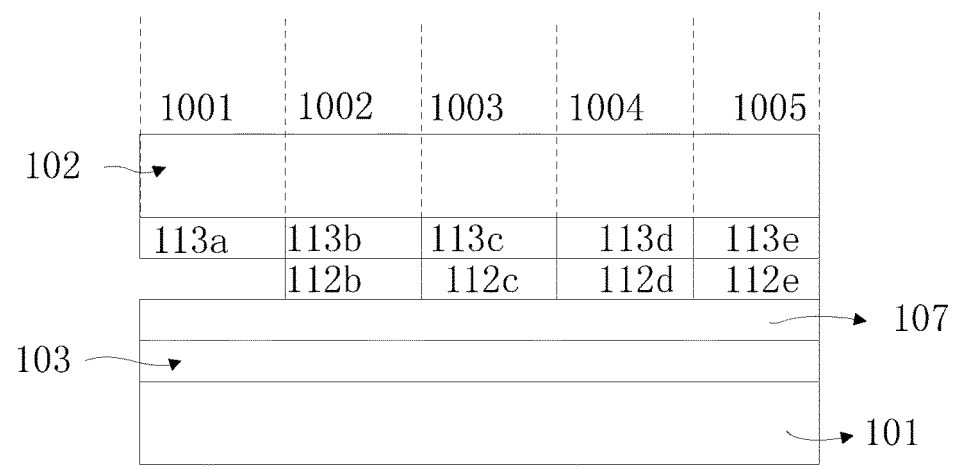
FIG. 4 is a schematic view of a structure of a top-emission type organic light emitting display panel, manufactured by a third method, according to a fourth embodiment of the invention.

As shown in FIG. 4, in a third method for preparing the top-emission type organic light emitting display panel, the organic light emitting layer 107, the quantum material layer and the color filter layer are sequentially formed on the array substrate.

In particular, the above method for preparing the top-emission type organic light emitting display panel includes the following steps:

S1: preparing an array substrate;

An array backplate 103 (including a thin film transistor 104 and an anode) is prepared on a glass substrate 101 to form the array substrate, and it should be understood that, the method for preparing the array substrate belongs to the prior art, and will not be elaborated herein.

S2: preparing an organic light emitting layer on the array substrate;

In this embodiment, a vacuum evaporation method is used to form the organic light emitting layer 107, in particular, the organic light emitting layer 107 of several colors are simultaneously evaporated on all the pixels of the array substrate so that the organic light emitting layer 107 emits white light, which is then filtered by the color filter layer of each sub-pixel to achieve the display. The manufacturing process of this method is simple, is high in yield rate, and can be used for a large scale display.

It should be understood that, it is also possible to evaporate the sub-pixels of various colors respectively to achieve the display.

It should be understood that, it is also possible to use an ink printing method or a laser transfer printing method to prepare the organic light emitting layer 107, which will not be elaborated herein.

S3: preparing a quantum material layer on the organic light emitting layer;

A quantum dot layer 112 is formed on the organic light emitting layer 107 by a patterning process. In the embodiment, a quantum material and a negative photoresist are mixed to prepare the quantum dot layer 112 by a patterning process, and the detailed preparation method is the same as that in the second embodiment; since the material of the organic light emitting layer 107 has high requirements on temperature (<100° C.) and water oxygen, the patterning process for the quantum dots should be performed on the premise that the lifetime of the quantum dots are ensured, and at the same time it is also required to ensure that the organic light emitting layer 107 is not destroyed. The above method of mixing the quantum material and negative photoresist and preparing the quantum dot layer 112 by a patterning process can meet the requirements on low temperature and low water oxygen so as to avoid damage to the organic light emitting layer 107.

It should be understood that, it is also possible to form the quantum dot layer 112 by an ink jet printing method.

In the similar manner as in the second embodiment, the quantum material layer in the embodiment may be a quantum rod layer or a quantum plate layer.

S4: preparing a color filter layer on the quantum material layer;

In this embodiment, the color filter layer is prepared at a low temperature, which belongs to the prior art and will not be elaborated herein. Since the color filter layer is prepared at a low temperature, adverse effects such as accumulating or light-emitting quenching will not be imposed on the quantum material.

At the same time, preparing the color filter at a low temperature includes photolithography, and the quantum dot layer 112 may absorb UV light during the UV exposure for the color filter layer, so as to prevent the organic light emitting layer 107 from being damaged by the UV irradiation.

It should be understood that, if the organic light emitting layer 107 is prepared by the ink jet printing method, the quantum dot layer may also be prepared by the ink jet printing method and the color filter layer may also be prepared at a low temperature or be prepared by the ink jet printing method.

Fifth Embodiment

The present embodiment provides an organic light emitting display device, including the above organic light emitting display panel.

Currently, light of different colors emitted from the organic light emitting display device are very different in properties such as luminous efficiency, energy efficiency and lifetime, as shown in Table 1:

TABLE 1 comparison of properties of light of different colors emitted from the organic light emitting display device

| Phosphorescence organic light emitting properties brightness (1000 cd/m$^2$) | CIE 1931 chromaticity coordinates | External quantum efficiency | Luminous efficiency cd/A | Service life (hour) | |
|---|---|---|---|---|---|
| | | | | LT 95% | LT 50% |
| Deep red | (0.69, 0.31) | 19% | 17 | 14,000 | 250,000 |
| Red | (0.66, 0.34) | 19% | 29 | 23,000 | 600,000 |
| Yellow | (0.44, 0.54) | 20% | 81 | 85,000 | 1,450,000 |
| Green | (0.31, 0.63) | 22% | 85 | 180,000 | 400,000 |
| Blue | (0.18, 0.42) | 6% | 40 | 700 | 20,000 |

From Table 1, it can be seen that the luminous efficiency and the service life for blue are relative bad.

The external quantum efficiencies of the red quantum dots and the green quantum dots, when being excited by blue light, are 19% and 22%, respectively. Organic light emitting layer of different colors and external quantum efficiencies of different quantum dots will cause different energy conversion efficiencies and different service life of the display device.

For example, there are three structures: an organic light emitting display device, the organic light emitting layer of which emits white light (WOLED); an organic light emitting display device, the organic light emitting layer of which emits blue light and which has a quantum dot layer (Blue-OLED+QD); an organic light emitting display device the organic light emitting layer of which emits white light and which has a quantum dot layer (WOLE+QD), and energy conversion efficiencies and service life of RGB colors in these three structures are shown in Table 2:

TABLE 2 comparison of energy conversion efficiencies and serve life of WOLED, Blue-OLED + QD and WOLED + QD structures

| | WOLED | | | Blue-OLED + QD | | | WOLED + QD | | |
|---|---|---|---|---|---|---|---|---|---|
| | R | G | B | R | G | B | R | G | B |
| External quantum efficiency | 19% | 22% | 6% | 1.1% | 1.2% | 6% | 24% | 23.2% | 6% |
| Service life (hour) LT50% | 600,000 | 400,000 | 20,000 | 20,000 | 20,000 | 20,000 | 600,000 | 400,000 | 20,000 |

It can be seen from Table 2 that, if the display structure, in which Blue-OLED is used as a backlight to excite the quantum dots, is used, the overall power consumption of the device increases about 5.5 times compared with the WOLED structure, the power consumptions for red and green will increase about 20 times; the overall service life of the device decreases 15 times compared with the WOLED structure, and the service life for red and green decrease 30 times and 20 times, respectively. At the same time, compared with the WOLED structure, for the WOLED+QD structure, the overall service life of the device does not decrease, and however the energy conversion efficiencies for red and green increase (reduce power consumption), thus in a practical application, the organic light emitting display device the organic light emitting layer of which emits white light and which has a quantum dot layer (WOLE+QD), can be used, since it has a higher service life and a lower power consumption.

Figure 5:
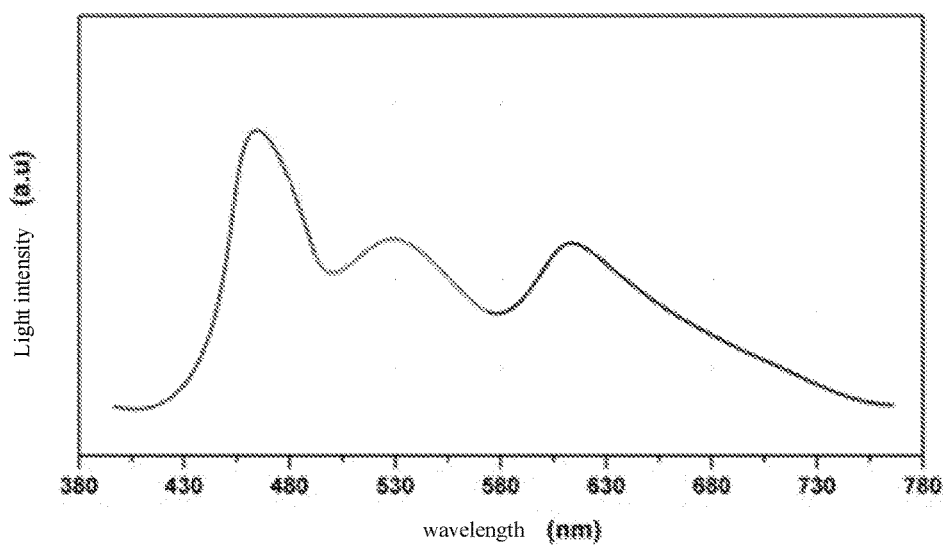
FIG. 5 is a schematic view illustrating a spectrum of white light emitted form a top-emission type organic light emitting display panel, an organic light emitting unit of which emits white light.
Figure 6:
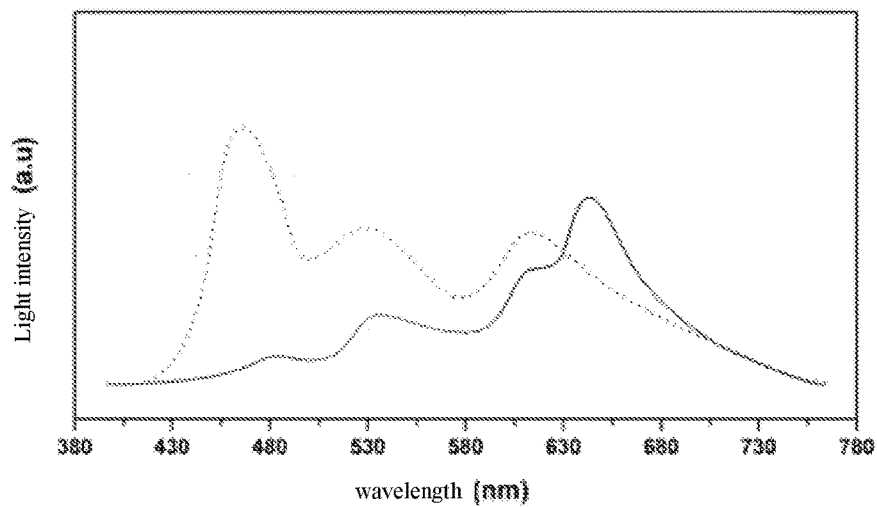
FIG. 6 is a schematic view illustrating a spectrum of light emitted form a top-emission type organic light emitting display panel, an organic light emitting unit of which emits white light and which includes red exciting quantum dots.

In addition, by referring to the spectrum of the white light emitted by the organic light emitting display device in WOLED structure as shown in FIG. 5, the spectrum for the organic light emitting display device in WOLED+QD structure, which includes red quantum dots and green quantum dots, are analyzed, and the following are found:

From FIG. 6, it can be seen that the organic light emitting display device including red quantum dots can convert more light in the white light spectrum, wavelengths of which are smaller than that of red color, into red light, and the utilization rate of light emitted from the organic light emitting layer is increased, brightness is improved, and power consumption is reduced.

Figure 7:
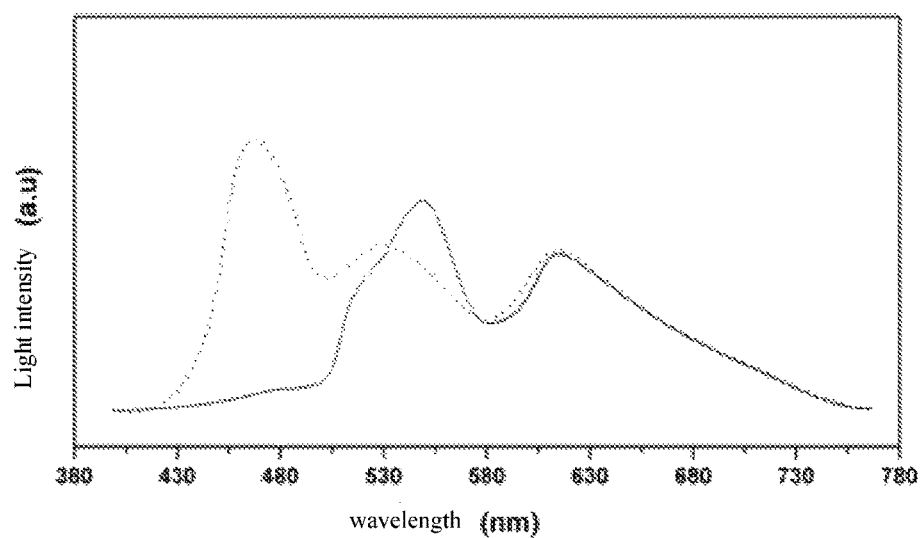
FIG. 7 is a schematic view illustrating a spectrum of light emitted form a top-emission type organic light emitting display panel, an organic light emitting unit of which emits white light and which includes green exciting quantum dots.

From FIG. 7, it can be seen that the organic light emitting display device including green quantum dots can convert more light in the white light spectrum, wavelengths of which are smaller than that of green color, into green light, and the utilization rate of light emitted from the organic light emitting unit is increased, brightness is improved, and power consumption is reduced.

It should be understood that, the above embodiments are merely exemplary embodiments used to describe the principle of the invention, and the invention is not limited thereto. The display device may be any product or member with a display function such as a mobile, a tablet computer, a television, a monitor, a laptop, a digital photo frame, a navigator. The above embodiments may be referred to for the embodiments of the display device, and will not be elaborated herein. As for a person skilled in the art, various changes and improvements may be made without departing from the spirit and substance of the invention, and these changes and improvements should be considered to be within the protection scope of the invention.

The invention claimed is:

1. An organic light emitting display panel, including: an array substrate and a color filter substrate arranged opposite to each other; an organic light emitting unit, which is arranged on a side of the array substrate close to the color filter substrate, the array substrate being configured to control the organic light emitting unit to emit light; and a plurality of pixel units arranged in a matrix formed by the array substrate and the color filter substrate, and each pixel unit including a plurality of sub-pixels, and each sub-pixel has a preset color;

wherein, the organic light emitting display panel further includes a quantum material layer at a sub-pixel region where a wavelength of light emitted from the organic light emitting unit is smaller than that of the preset color of the sub-pixel, and the quantum material layer can exhibit size effect to convert a part of light emitted thereinto from the organic light emitting unit into light of a same color as the preset color of a corresponding sub-pixel.

2. The organic light emitting display panel of claim 1, wherein the quantum material layer is provided on a side of the color filter substrate close to the array substrate.

3. The organic light emitting display panel of claim 2, wherein the color filter substrate further includes a substrate and a color filter layer provided on the substrate, and the quantum material layer is provided on the color filter layer.

4. The organic light emitting display panel of claim 1, wherein the quantum material layer is provided on a side of the array substrate close to the color filter substrate.

5. The organic light emitting display panel of claim 4, wherein the color filter substrate further includes a color filter layer.

6. The organic light emitting display panel of claim 4, wherein the array substrate further includes a color filter layer provided above the quantum material layer.

7. The organic light emitting display panel of claim 1, wherein the plurality of sub-pixels include primary color sub-pixels and white sub-pixels; and the primary color sub-pixels include red sub-pixels, blue sub-pixels, green sub-pixels, and yellow sub-pixels.

8. The organic light emitting display panel of claim 7, wherein the organic light emitting unit includes a white light source and a blue light source.

9. The organic light emitting display panel of claim 7, wherein
the organic light emitting unit is the white light source;
the color filter substrate includes sub-pixel color filter layers corresponding to the red sub-pixels, the blue sub-pixels, the green sub-pixels, and the yellow sub-pixels, respectively; and
the quantum material layer includes sub-pixel quantum material layers corresponding to the red sub-pixels, the green sub-pixels, and the yellow sub-pixels, respectively.

10. The organic light emitting display panel of claim 7, wherein
the organic light emitting unit is the blue light source;
the color filter substrate includes sub-pixel color filter layers corresponding to the red sub-pixels, the green sub-pixels, and the yellow sub-pixels, respectively; and
the quantum material layer includes sub-pixel quantum material layers corresponding to the red sub-pixels, the green sub-pixels, the yellow sub-pixels, and the white sub-pixels, respectively.

11. The organic light emitting display panel of claim 1, wherein the quantum material layer includes a quantum dot, a quantum rod, and/or a quantum plate.

12. The organic light emitting display panel of claim 11, wherein the quantum dot, the quantum rod and the quantum plate each includes a core material, a ligand and a shell material, and wherein the core material includes CdS, CdSe, CdTe, PbSe, CuInS, InP or a carbon nanomaterial.

13. A method for manufacturing the organic light emitting display panel of claim 1, including steps of:
preparing an array substrate;
preparing an organic light emitting layer on the array substrate;
preparing a color filter substrate;
preparing a quantum material layer on the color filter substrate at a sub-pixel region where a wavelength of light emitted from the organic light emitting unit is smaller than that of the preset color of the sub-pixel such that the quantum material layer can exhibit size effect to convert a part of light emitted thereinto from the organic light emitting unit into light of a same color as the preset color of a corresponding sub-pixel; and
assembling the array substrate provided with the organic light emitting layer and the color filter substrate provided with the quantum material layer so that the array substrate and the color filter substrate are arranged opposite to each other.

14. The method for manufacturing the organic light emitting display panel of claim 13, wherein the step of preparing a quantum material layer on the color filter substrate includes mixing a quantum material with a negative photoresist, and forming the quantum material layer by a patterning process or an ink jet printing method.

15. A method for manufacturing the organic light emitting display panel of claim 1, including steps of:
preparing an array substrate;
preparing an organic light emitting layer on the array substrate;
preparing a quantum material layer on the organic light emitting layer at a sub-pixel region where a wavelength of light emitted from the organic light emitting unit is smaller than that of the preset color of the sub-pixel such that the material layer can exhibit size effect to convert a part of light emitted thereinto from the organic light emitting unit into light of a same color as the preset color of a corresponding sub-pixel;
preparing a color filter substrate; and
assembling the array substrate provided with the organic light emitting layer and the quantum material layer and the color filter substrate so that the array substrate and the color filter substrate are arranged opposite to each other.

16. The method for manufacturing the organic light emitting display panel of claim 15, wherein the step of preparing a quantum material layer on the organic light emitting layer includes mixing a quantum material with a negative photoresist, and forming the quantum material layer by a patterning process or an ink jet printing method.

17. A method for manufacturing the organic light emitting display panel of claim 1, including steps of:
preparing an array substrate;
preparing an organic light emitting layer on the array substrate;
preparing a quantum material layer on the organic light emitting layer at a sub-pixel region where a wavelength of light emitted from the organic light emitting unit is smaller than that of the preset color of the sub-pixel such that the quantum material layer can exhibit size effect to convert a part of light emitted thereinto from the organic light emitting unit into light of a same color as the preset color of a corresponding sub-pixel; and preparing a color filter layer on the quantum material layer.

18. The method for manufacturing the organic light emitting display panel of claim 17, wherein the step of preparing a quantum material layer on the organic light emitting layer includes mixing a quantum material with a negative photoresist, and forming the quantum material layer by a patterning process or an ink jet printing method.

19. The method for manufacturing the organic light emitting display panel of claim 17, wherein the step of preparing the color filter layer on the quantum material layer includes preparing the color filter layer at a low temperature.

20. An organic light emitting display device, including the organic light emitting display panel of claim 1.

* * * * *